US010666281B2

(12) United States Patent
Pernull et al.

(10) Patent No.: US 10,666,281 B2
(45) Date of Patent: May 26, 2020

(54) METHOD, DEVICE AND SYSTEM FOR ANALOG-TO-DIGITAL CONVERSION

(71) Applicant: Infineon Technologies AG, Neubiberg (DE)

(72) Inventors: Martin Pernull, Villach (AT); Peter Bogner, Wernberg (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 16/386,699

(22) Filed: Apr. 17, 2019

(65) Prior Publication Data

US 2019/0326920 A1 Oct. 24, 2019

(30) Foreign Application Priority Data

Apr. 20, 2018 (DE) .......................... 10 2018 109 556

(51) Int. Cl.
| | | |
|---|---|---|
| *H03M 1/10* | (2006.01) | |
| *H03M 1/56* | (2006.01) | |
| *H03M 1/12* | (2006.01) | |

(52) U.S. Cl.
CPC ........... *H03M 1/1033* (2013.01); *H03M 1/56* (2013.01); *H03M 1/1215* (2013.01)

(58) Field of Classification Search
CPC ..... H03M 1/1033; H03M 1/56; H03M 1/1215
USPC .................................................. 341/155, 120
See application file for complete search history.

(56) References Cited

U.S. PATENT DOCUMENTS

| | | | |
|---|---|---|---|
| 9,608,652 B2 * | 3/2017 | Lee ....................... | H03M 1/002 |
| 10,218,377 B2 * | 2/2019 | Bogner ............... | H03M 1/1014 |
| 10,243,577 B1 * | 3/2019 | Berens ................ | H03M 1/1047 |
| 10,367,517 B2 * | 7/2019 | Wu ....................... | H03M 1/442 |

FOREIGN PATENT DOCUMENTS

| | | |
|---|---|---|
| DE | 112014006772 T5 | 3/2017 |
| WO | 2016003432 A1 | 1/2016 |

\* cited by examiner

*Primary Examiner* — Brian K Young
(74) *Attorney, Agent, or Firm* — Slater Matsil, LLP

(57) ABSTRACT

In accordance with an embodiment, a method for calibrating at least two analog-to-digital converters includes feeding an analog predefined signal to the at least two analog-to-digital converters; converting the analog predefined signal into at least two converter-associated digital values using the at least two analog-to-digital converters, wherein the converting is based on a received clock signal; and adapting a converter-specific time delay based on the at least two converter-associated digital values.

18 Claims, 4 Drawing Sheets

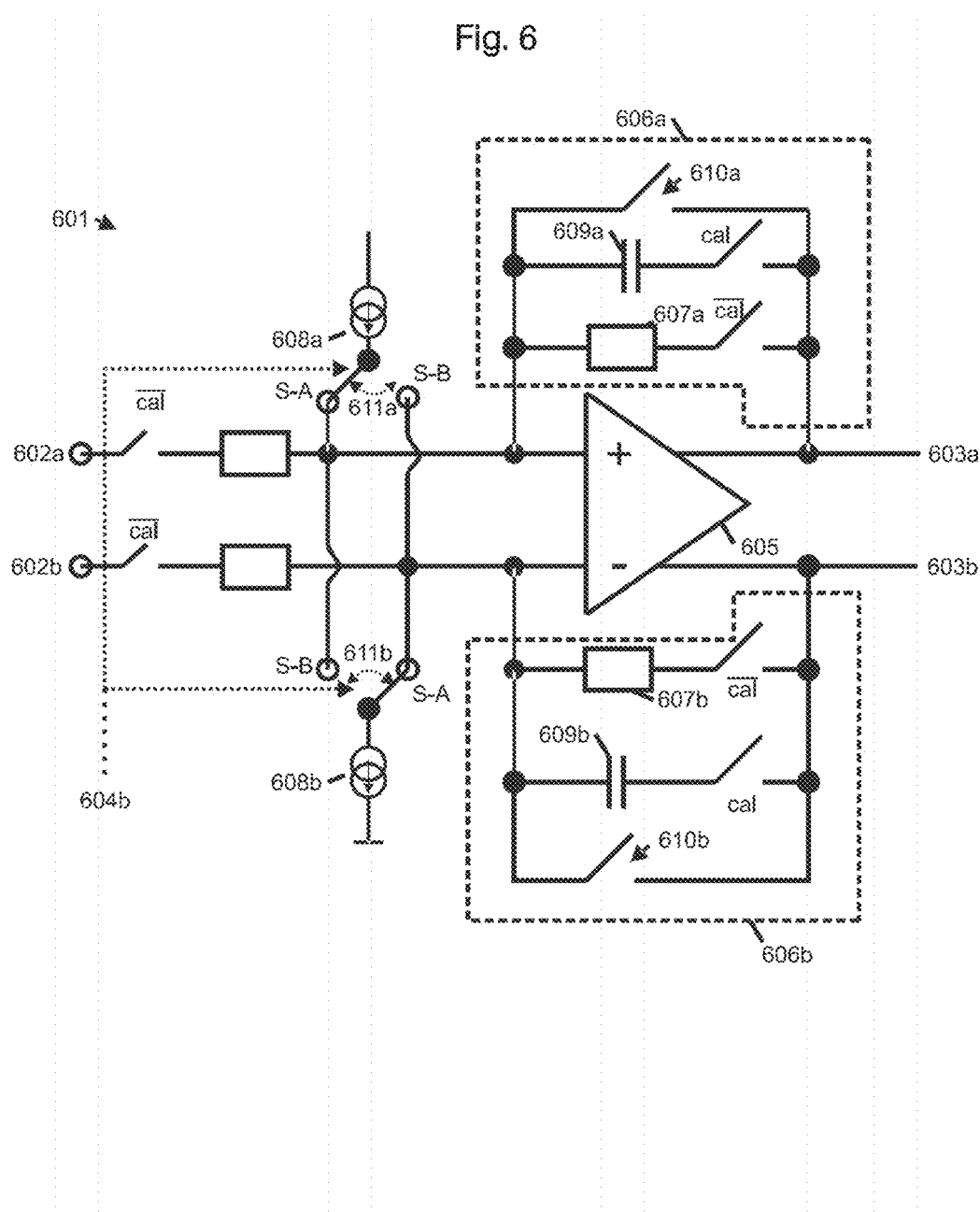

METHOD, DEVICE AND SYSTEM FOR ANALOG-TO-DIGITAL CONVERSION

This application claims the benefit of German Application No. 102018109556.2, filed on Apr. 20, 2018, which application is hereby incorporated herein by reference in its entirety.

TECHNICAL FIELD

This disclosure relates generally to methods and devices for analog-to-digital conversion.

BACKGROUND

Time-interleaved analog-to-digital converter arrangements (referred to as: time interleaved analog-digital converters, time-interleaved ADCs) constitute one possibility for converting analog values into digital values. In this case, a plurality of analog-to-digital converters are clocked in a time-interleaved manner, such that it is possible to digitize the analog signal at a multiple of the sampling rate of the individual analog-to-digital converters. For this purpose, the different analog-to-digital converters have to operate with a fixed temporal relationship, in particular at intervals distributed uniformly over a clock period, in order to ensure an optimum interaction of the analog-to-digital converters. Undesired time skews between individual analog-to-digital converters are referred to as a time skew error.

One conventional procedure for eliminating such time skew errors consists in performing a digital calibration of time skews. For this purpose, a known calibration signal is fed to the analog-to-digital converter arrangement, and an adaptive digital filter utilizes an output signal of the analog-to-digital converter arrangement to compensate for the time error, wherein the setting of the filter is performed on the basis of a comparison of calibration signal and output signal. This can mean a high complexity and it can thus take a long time until a calibration is concluded.

Another conventional procedure may be based on parallel operation of pairs of analog-to-digital converters using a rapidly changing input signal. In the case of operation without a time skew error, the output values of the analog-to-digital converters operated in parallel are identical. Disadvantages may consist in the fact that the operating mode for the calibration may differ from the normal conversion operating mode during the analog-to-digital conversion of useful signals and, on account of different loads at assemblies, the resulting calibration may differ from an optimum calibration in a normal conversion operating mode.

A further conventional method may consist in modifying the order of the sampling by the analog-to-digital converters by means of an algorithm. The selection of the order may be random or carried out according to other criteria. However, this may result in an increased area requirement of the circuit and a higher power consumption. A further effect may consist in the fact that the time skew error is not completely eliminated in some cases.

SUMMARY

In accordance with one exemplary embodiment, a method for calibrating at least two analog-to-digital converters is provided, wherein the at least two analog-to-digital converters each receive a clock signal, wherein at least one of the at least two analog-to-digital converters receives the clock signal with a converter-specific time delay. In this case, the method comprises the following steps: feeding an analog predefined signal to the at least two analog-to-digital converters, converting the predefined signal into at least two converter-associated digital values by means of the at least two analog-to-digital converters, wherein the converting is based in each case on the respectively received clock signal, and adapting the at least one converter-specific time delay on the basis of the at least two converter-associated digital values.

In accordance with a further exemplary embodiment, a method for the analog-to-digital conversion of analog signals by means of at least two analog-to-digital converters is provided. This involves carrying out a calibration of at least one converter-specific time delay according to the previous exemplary embodiment and/or further exemplary embodiments.

In accordance with a further exemplary embodiment, a buffer circuit is provided. The buffer circuit comprises at least one buffer input for at least one analog signal, at least one calibration control input and at least one analog output. In this case, the buffer circuit comprises at least one operational amplifier which comprises first terminals, comprising a first terminal and a second terminal, and wherein the buffer circuit is configured to comprise at least the following operating modes: a buffer operating mode, wherein the buffer circuit (601) is configured, in reaction to a received first signal at the at least one calibration control input (604a,b), to connect at least one resistor (607a,b) between the first terminal of the operational amplifier (605) and the second terminal of the operational amplifier (605) such that the at least one analog signal is received at the at least one buffer input (602a, 602b) and is provided at the at least one analog output (603a, 603b).

Furthermore, the buffer circuit is configured to comprise a calibration operating mode, wherein the buffer circuit is configured, in reaction to a received second signal at the at least one calibration control input, to connect at least one capacitance between the first terminal and the second terminal of the operational amplifier and to connect a reset switch in parallel with the at least one capacitance and also to connect at least one current source to the first input of the operational amplifier.

In a further exemplary embodiment, a device is provided. Said device comprises at least two analog-to-digital converters, wherein the at least two analog-to-digital converters are configured to receive a respective clock signal, wherein at least one of the analog-to-digital converters is coupled to a converter-specific time delay circuit. The converter-specific time delay circuit is configured to provide for the at least one analog-to-digital converter the clock signal with a converter-specific time delay, and the at least two analog-to-digital converters are configured to convert a received analog input signal into converter-associated digital values, wherein the at least two analog-to-digital converters are configured to receive an analog predefined signal as the analog input signal. The device further comprises a control circuit, which is configured to receive the converter-associated digital values generated in response to the analog predefined signal and to perform an adaptation of a setting of the converter-specific time delay circuit on the basis of the converter-associated digital values.

In a further exemplary embodiment, a system is provided which comprises one or more of the devices according to exemplary embodiments above and is configured to carry out a method according to exemplary embodiments above.

BRIEF DESCRIPTION OF THE DRAWINGS

FIG. 6 shows a buffer circuit in accordance with various exemplary embodiments.

DETAILED DESCRIPTION OF ILLUSTRATIVE EMBODIMENTS

Figure 1:
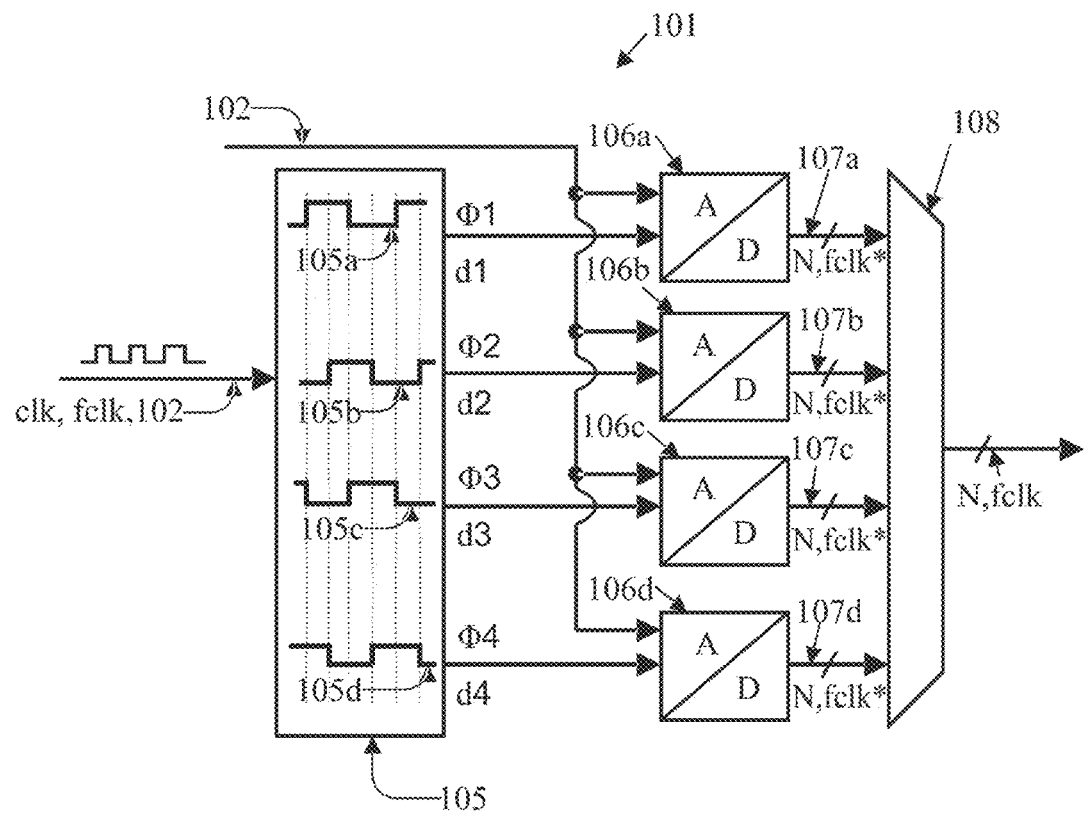
FIG. 1 shows a time-interleaved analog-to-digital converter arrangement as a basis for various exemplary embodiments.

Various exemplary embodiments are described in detail below with reference to the accompanying drawings. These exemplary embodiments should be regarded merely as an example and should not be interpreted as restrictive. By way of example, in other exemplary embodiments, some of the features or components described can be omitted and/or be replaced by alternative features or components. Features or components of different exemplary embodiments can be combined in order to form further exemplary embodiments. Variations and modifications described with regard to one exemplary embodiment can also be applied to other exemplary embodiments. Furthermore, features or components different than those described or shown can be provided, in particular features or components used in conventional analog-to-digital converters.

Direct connections or couplings that are shown in the drawings or are described below, i.e. electrical connections or couplings without intervening elements (for example simple metal conductor tracks), can also be realized by indirect connections or couplings, i.e. connections or couplings comprising one or more additional intervening elements, and vice-versa, as long as the general functioning of the respective connection or coupling, for example providing a voltage, providing a current, conducting an analog or digital signal or providing a control signal, is substantially maintained.

The methods described above and below can also be stored, for control by means of a computer, as instructions on a storage medium materially present, for example as instructions for the time calibration circuit 207. The time calibration circuit can be implemented on a PC comprising a memory and a processor, but also as a hardwired logic, an ASIC or some other embodiment.

In the figures, identical reference signs designate identical or similar elements. The figures are schematic representations of various exemplary embodiments. Elements illustrated in the figures are not necessarily illustrated as true to scale. Rather, the various elements illustrated in the figures are rendered in such a way that their function and general purpose become understandable to the person skilled in the art.

Numerical values mentioned in association with exemplary embodiments, for example in association with idealized or simulated curves, serve merely for explanation purposes. Numerical values and waveforms of curves should not be interpreted as restrictive and are dependent on the choice of method and/or device parameters.

In the context of this application, substantially linear or approximately linear means that the signal profile differs from an idealized signal profile by not more than 30%, preferably not more than 20%, with further preference differs by not more than 5%, and with even further preference differs by not more than 2%.

In the context of this application, linearity errors denote deviations according to which a signal profile departs systematically from an idealized linear profile, for example on account of real properties of electronic components used for generating the signal profile, for example on account of a non-ideal integrator circuit, which may have for example a finite gain in the operational amplifier. However, other causes such as incomplete settling, parasitic capacitances and similar effects can also lead to linearity errors. In some cases, however, linearity errors may substantially not impair the monotonicity of a signal, in some cases may even not impair it at all.

Jitter or jitter error is understood to mean the random deviation from the ideal clock edge instant.

Noise is understood to mean the random deviation from the ideal signal value.

The order of magnitude of these influences depends on the desired signal-to-noise ratio. For calibrations it may be possible, in the case of random disturbance variables, by means of appropriately frequent repetition of the measurement, theoretically to proceed with arbitrarily poor values for jitter and noise. In practice, however, there may be further requirements in respect of the quality of the values, for example as a result of the time available for the calibration.

Falling and rising signal profiles are described in this application. In this case, it should be noted that it is also possible to modify signal profiles by using the respectively deflected signal profile at appropriate points, such that, for example, an initially rising then falling signal is converted into an initially falling then rising signal by a circuit or is used alternatively. In the following description and in the claims, in the interest of linguistic simplification, this possibility is not always mentioned explicitly, but is always possible as an alternative exemplary embodiment.

Converting an analog input signal into converter-associated digital values by means of analog-to-digital converters may be characterized by converter-associated transfer functions. In some applications, for a relevant dynamic range of the analog-to-digital converters that is required for the respective application, a linear behavior of the transfer function of the analog-to-digital conversion is striven for. The person skilled in the art knows numerous methods for fostering such a linear behavior of the analog-to-digital converters, for example dynamic element matching and linearity calibration. In addition, analog-to-digital converters may have been calibrated, or be calibrated, in a known manner with regard to their gain and with regard to an offset. Such additional conventional calibrations and techniques can be combined with methods described.

FIG. 1 shows a time-interleaved analog-to-digital converter arrangement as a basis for exemplary embodiments.

The arrangement 101 of analog-to-digital converters as shown schematically in FIG. 1 receives an analog input signal 102 and outputs the latter as a digital output signal 103. The digitizing of the analog input signal 102 is based on a periodic clock signal 104, clk, having a clock frequency fclk, which clock signal is likewise provided at an input. The clock signal can be a rectangular voltage, as shown schematically in FIG. 1, but other clock signal waveforms, for example sinusoidal, triangular or sawtooth waveforms, are also possible. In particular, the clock signal determines sampling instants of the arrangement 101. The sampling instants can be determined by rising edges, falling edges or both edges of the clock signal.

The clock signal 104 is distributed by a delay circuit 105, which comprises converter-specific time delay circuits 105a, 105b, 105c, 105d, among four analog-to-digital converters 106a, 106b, 106c, 106d (hereinafter, reference is made to the four analog-to-digital converters 106a-d jointly using the reference sign 106) on converter-specific channels and is delayed differently for the respective channel, such that the analog-to-digital converters 106 receive the clock signal with a respective converter-specific time delay d1, d2, d3, d4. The delays of the individual analog-to-digital converters may additionally be influenced by the distribution of the clock signal 104 and/or by a mismatch possibly existing between electronic components of the circuit, for example between the individual delay channels and/or the analog-to-digital converters. The actual delays of the analog-to-digital converters may thus comprise components from the (controllable) setting of the delay circuit 105 and the (non-controllable) properties of the circuit components, for example the adaptation of the various analog-to-digital converters 106a, 106b, 106c, 106d to the clock signal 104.

Consequently, the sampling instants of the individual analog-to-digital converters 106 are dependent on the respective converter-specific time delay. In exemplary embodiments, the converter-specific time delays are chosen such that the sampling instants of different analog-to-digital converters 106 are distributed at identical intervals over one or more periods of the clock signal clk. In some examples, said converter-specific time delays d1-d4 may be described as converter-specific phases Φ1-Φ4 of the clock signal 104. In some cases, one of the analog-to-digital converters 106 can receive the clock signal with a converter-specific time delay of 0, such that the converter-specific time delay circuit can be omitted here. The analog-to-digital converters 106 thus receive the clock signal with a converter-specific time delay and convert the input signal 102 into converter-associated digital values 107a-d (hereinafter designated jointly by 107), wherein combining the respective converter-associated digital values 107 to form a digital output signal 103 having N bits is based on the respective converter-specific clock signal 105 and is carried out in each case with a clock frequency fclk*. Here fclk* can be less than fclk, for example a fraction of fclk, for example fclk divided by the number of analog-to-digital converters 106. By way of example, fclk*=fclk/4 can hold true in the example in FIG. 1. For this purpose, the digital values 107 are each provided to a combination circuit 108, sometimes also referred to as a multiplex circuit. Given sufficiently good calibration of the arrangement of analog-to-digital converters 10t, in the combination circuit 108, the digital output signal 103, which comprises digital output values, can be combined from the converter-associated digital values 107 such that it likewise has N bits, wherein the sampling rate of the output signal can once again correspond to fclk. This can be four times the clock frequency in the example shown in FIG. 1.

The number of analog-to-digital converters can be varied here depending on the application. The above-described advantage of increasing the sampling rate of the output signal may be afforded, in some exemplary embodiments, starting from a use of two analog-to-digital converters, wherein, in some variants, a converter-specific time delay has to be predefined only for one of the two analog-to-digital converters and the other analog-to-digital converter may receive the clock signal directly.

Figure 2:
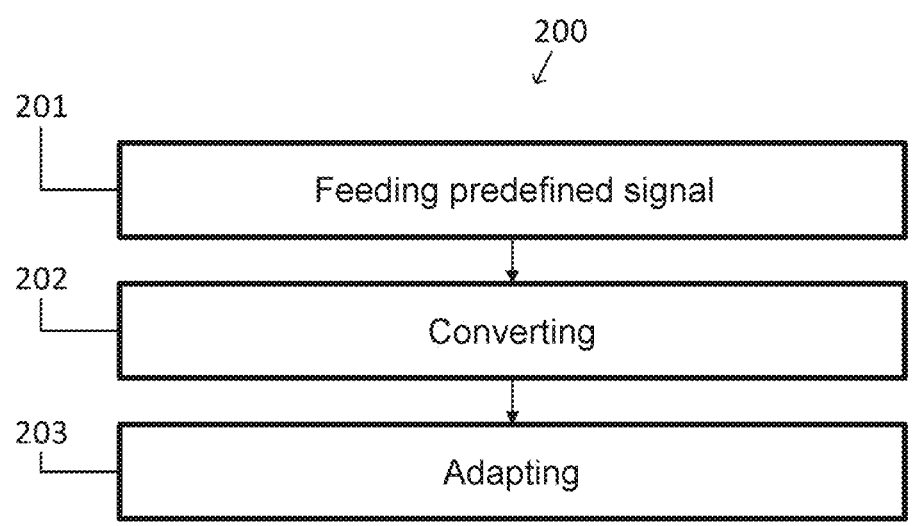
FIG. 2 shows a method in accordance with various exemplary embodiments.

FIG. 2 shows a method in accordance with various exemplary embodiments.

In order to afford a better understanding, the method in FIG. 2 is discussed with reference to the device shown in FIG. 1 and the signals shown in FIGS. 3a and 4a. It should be noted that the methods described can also be applied generally, for example to devices and/or signal waveforms different than those shown in the examples in the figures.

The method 200 shown is a method for calibrating an arrangement of analog-to-digital converters. In order to carry out the method, at least two analog-to-digital converters are provided, wherein the at least two analog-to-digital converters receive a clock signal and at least one of the at least two analog-to-digital converters receives the clock signal with a converter-specific time delay. A device in which the method described may be applied may be similar to or correspond to the arrangement 101 shown schematically in FIG. 1.

At 201, the method comprises feeding an analog predefined signal to the at least two analog-to-digital converters. By way of example, the predefined signal can be provided as an analog input signal 102 at the arrangement 101 from FIG. 1. The predefined signal 301, also referred to as calibration signal, can be for example a linear ramp signal, as shown in FIGS. 3a and 4a.

In some exemplary embodiments, the predefined signal is a strictly monotonically rising and/or strictly monotonically falling signal at least in sections. By way of example, the signal 301 shown in FIGS. 3 and 4 is strictly monotonically rising in the time period shown.

Strictly monotonic should be understood here as strictly monotonic within the scope of customary device tolerances and unavoidable disturbance influences. By way of example, in signals realized by means of circuits, deviations with respect to desired properties may always arise, for example on account of noise or disturbance influences, or as a result of systematic influences, such as limited gain, for example. In association with the application, strictly monotonic also includes cases in which deviations from the strictly monotonic profile arise on account of disturbance influences. Monotonic here denotes the profile in the ranges and on the time scales with which the signal is used. In this regard, within the meaning of this application, by way of example, a noisy or rapidly oscillating signal is also monotonic if the noise and/or the oscillating occur(s) with a smaller amplitude and/or with a higher frequency than the use of the signal. A signal which exhibits a non-monotonic behavior in the meantime, for example as a result of a momentary fall in level to a constant value, but behaves like a monotonic signal for the instants at which the signal is used is also regarded as monotonic.

In some exemplary embodiments, the predefined signal can be a periodic signal. By way of example, the ramp signals shown in FIGS. 3a and 4a can be continued periodically as a sawtooth signal or a triangular signal.

In this regard, in some exemplary embodiments, the periodic signal can comprise a first and a second signal section, wherein the periodic signal can be strictly monotonically rising in the first signal section.

In some exemplary embodiments, the periodic signal can be strictly monotonically falling in the second signal section.

In some exemplary embodiments, the predefined signal can be approximately linear in the first signal section and/or second signal section.

Monotonicity of the predefined signal can simplify making a statement about the temporal sequence of the signal values at digitizing instants. By way of example, the digitized values of two analog-to-digital converters can be compared. If the latter have sufficiently similar conversion properties, it can be deduced that a higher digitized value was converted later if a strictly monotonically rising signal is involved. The same applies, mutatis mutandis, to a strictly monotonically falling signal.

If further properties of the signal over and above pure monotonicity are known, the relation of the instants can also be deduced quantitatively.

A linearity in a signal section may have the advantage that an unambiguous assignment of a digitized value of the signal in the relevant signal section to an instant can be effected. A further advantage of the linearity may be that the time skew of the respective digitizing instants can be deduced quantitatively on the basis of the difference between two digital values digitized at different instants. This is likewise explained in greater detail further below.

In some exemplary embodiments, however, the signal may have linearity errors or be nonlinear.

In some exemplary embodiments, at least two of the at least two analog-to-digital converters 106a-d, 501a-d receive the clock signal 104 with a converter-specific time delay d1-d4, wherein the multiplicity of conversions over at least two periods of the predefined signal 301 comprises a permutation of the converter-specific time delays d1-d4 between at least two of the multiplicity of periods of the predefined signal, and wherein in addition adapting the at least two converter-specific time delays d1-d4 is based on an averaging of the converter-associated digital values D0', D0-D3 over the at least two periods of the predefined signal 301.

In some exemplary embodiments, adapting the at least two converter-specific time delays d1-d4 can be based on at least one first difference, which is ascertained on the basis of two converter-associated digital values D0', D0-D3 in a first period of the predefined signal, and on at least one second difference, which is ascertained on the basis of two converter-associated digital values D0', D0-D3 in a second period of the predefined signal.

In this case, the adapting can comprise an averaging over the first and second differences and, in some exemplary embodiments, further differences.

By virtue of carrying out a permutation of the converter-specific time delays d1-d4 between different periods, even in cases in which linearity errors are present, for example in the case of monotonic signal profiles, it is possible to carry out an adapting which, as a result, can be insensitive vis-à-vis linearity errors and other disturbance influences.

In some exemplary embodiments, the effect of disturbance influences can be extracted by averaging the differences obtained, for example by forming a difference between the digital values and swapping the instants at which the digital values are determined from signal period to signal period, such that over a multiplicity of signal periods the difference is ascertained at different points of the signal.

This may on the one hand make the method very robust vis-à-vis linearity errors of the predefined signal, but also allow the method to be carried out with nonlinear signals. In this case, the signals can be monotonic. The permutation can comprise a cyclic permutation, which can also be referred to as rotation. In some implementations, permutations can be provided for example using shift registers, for example using barrel shifter shift registers. However, a random, or pseudo-random, permutation is also possible.

Moreover it is possible for the converter-specific time delays to comprise two time delay values, wherein it may be possible for only one respective time delay value to be permuted. This may be particularly advantageous if the time delay circuits 105a-d are connected in a concatenation (see below).

One example of a permutation is shown in the table below. In this case, the conversion is carried out by way of example at various fixed instants. Five instants, designated by Φ0*-Φ3* and Φ0'* in accordance with FIG. 3a, are chosen in the following example, wherein the reference to FIG. 3a is likewise only by way of example and can also be used for completely different waveforms of a signal, which in particular can deviate from the signal waveform 301 as described above. The analog-to-digital converters are designated by AD0-AD4. In some exemplary embodiments, these analog-to-digital converters may correspond or be similar to the analog-to-digital converters 106 shown in FIG. 1.

|  | Instant (column) | | | | |
| --- | --- | --- | --- | --- | --- |
| Pass (row) | Φ0* | Φ1* | Φ2* | Φ3* | Φ0'* |
| Pass 1 | AD0 | AD1 | AD2 | AD3 | AD4 |
| Pass 2 | AD4 | AD0 | AD1 | AD2 | AD3 |
| Pass 3 | AD3 | AD4 | AD0 | AD1 | AD2 |
| Pass 4 | AD2 | AD3 | AD4 | AD0 | AD1 |
| Pass 5 | AD1 | AD2 | AD3 | AD4 | AD0 |

In this case, the numbering of the passes, which numbering can be defined depending on the signal periods, should be understood merely as an example.

Other permutation sequences are also possible. In some exemplary embodiments, permutations can be chosen such that for each instant after a specific number of passes all analog-to-digital converters have been measured. In other examples only a subset of the analog-to-digital converters are measured for each instant.

Step 202 involves converting the predefined signal into at least two converter-associated digital values by means of the at least two analog-to-digital converters, wherein the converting is based in each case on the clock signal, which is delayed with the converter-specific time delay in the case of the at least one analog-to-digital converter.

Step 203 involves adapting the at least one converter-specific time delay on the basis of the at least two converter-associated digital values, for example on the basis of ascertaining a relation between the sampling instants as explained above.

This converting and adapting are likewise explained further below on the basis of examples in FIGS. 3b and 4b.

In some exemplary embodiments, adapting the converter-specific time delays can be based on a multiplicity of conversions over a multiplicity of periods of the predefined signal, if the predefined signal is a periodic signal as explained above.

In some exemplary embodiments, this can have the advantage that the calibration method can be based on multiple repetitions and digitizing errors, for example caused by jitter errors and/or noise, can thus be reduced by averaging values.

In some exemplary embodiments, the method is carried out repeatedly, wherein for each carrying out the at least two analog-to-digital converters are selected from an arrangement of at least three analog-to-digital converters, and wherein the adapting is carried out on the basis of the at least two converter-associated values from the repeated passes.

This can have the advantage that only a portion of the analog-to-digital converters is operated during a period, which affords a greater flexibility for the choice of the ramp signal and can reduce the complexity for the adapting. By way of example, the first and second analog-to-digital converters can be calibrated in a first subgroup of calibration processes, the second and third analog-to-digital converters in a second subgroup of calibration processes, etc., until the desired number of analog-to-digital converters, all of them in some exemplary embodiments, have been calibrated. In this case, the time relationships of all the analog-to-digital converters can be related to one another as a result, such that, in some exemplary embodiments, the time relationships of analog-to-digital converters which are represented in at least two subgroups together with the items of time information of analog-to-digital converters which are respectively not represented in the two subgroups can be related to one another.

In the example above, the time relation of first and third analog-to-digital converters can be ascertained from an analysis of the time relation of first and second analog-to-digital converters and of second and third analog-to-digital converters. In this case, in a departure from the example above, the composition of the subgroups can for example also be effected with at least one fixedly chosen analog-to-digital converter represented in all groups or with a random choice of one or more analog-to-digital converter(s). A further advantage of this procedure may be, in some exemplary embodiments, as described above, that the respective analog-to-digital converters perform the conversion of the predefined signal at different points of the predefined signal. Likewise, in some exemplary embodiments, the permutations described above can be distributed among a plurality of subgroups.

In some exemplary embodiments, adapting the converter-specific time delays can be based generally on a comparison of the at least two converter-associated digital values with a known characteristic of the predefined signal.

This can have the advantage that the digitizing instant can be deduced from the converter-associated digital values even for nonlinear signals on account of the known characteristic of the predefined signal. The procedure described above for linear signal waveforms is possible in modified form for more complex waveforms as well. If it is known, for example, that the signal has a quadratic profile as a function of time, digitized measurement points of the signal can be temporally related to one another by a comparison being made, for example, of when a value, possibly taking account of an offset, has doubled, quadrupled, etc., in order thus to deduce the digitizing instant. Such methods are familiar to the person skilled in the art for other signal waveforms, too, within the scope of the activity of the person skilled in the art. In the case of signal waveforms having an injective functional relationship between time and signal value, such an assignment is unambiguously possible.

In some exemplary embodiments, the method 200 can furthermore comprise decreasing all the converter-specific time delays, if at least one of the converter-specific time delays reaches a maximum value, and/or increasing all the converter-specific time delays if at least one of the converter-specific time delays reaches a minimum value.

In some exemplary embodiments, this may have the advantage that it may be possible to calibrate the delays of the converter-specific delay even if the method results in the limit of a converter-specific delay being reached, for example because the converter-specific delay has to be set to zero, or because the converter-specific delay reaches a maximum possible value. By virtue of the fact that all converter-specific delays are shifted in such a case, it may be possible to avoid such problems. It is possible that as a result of this shifting the time skew between clock signals fed to the individual analog-to-digital converters is substantially not altered. This may be the case completely, or at least partly, for example if there is a mismatch between the individual delay channels. In these cases, by means of the methods described here, a renewed calibration can be carried out or the calibration can be continued.

The arrangement of analog-to-digital converters can comprise at least three analog-to-digital converters, which each receive the clock signal with a converter-specific time delay. In this case, the converter-specific time delays can be effected successively, for example by means of time delay circuits connected in concatenation. However, the converter-specific time delays can also be provided to the analog-to-digital converters without concatenation. In both exemplary embodiments, the calibration can be carried out during a substantially linear signal section of the predefined signal as explained above, wherein a respective difference between the converter-associated digital values of the respective converter and a respective previous analog-to-digital converter can be formed. In exemplary embodiments in which the converter-specific time delays are provided by means of a concatenation, the respective previous analog-to-digital converter can correspond to the analog-to-digital converter which obtained a time delay value before the respective analog-to-digital converter. In exemplary embodiments in which no concatenation is effected, the respective previous analog-to-digital converter can be determined on the basis of the respective delay values set. By way of example, that analog-to-digital converter having the next smaller delay vis-à-vis the respective analog-to-digital converter can be determined as the respective previous analog-to-digital converter.

The first analog-to-digital converter can constitute an exception here since, in some exemplary embodiments, no previous value can be available. In the case of periodic repetition, in some exemplary embodiments, however, it is also possible to use the first value of a new pass with the last value of the previous pass. Furthermore, it is possible to form an average value from the converter-associated differences. In this case, in some exemplary embodiments, as described above, the averaging can be based on permutations of converter-specific time delays between the signal periods. The averaging can also be effected by means of addition. Moreover, it is possible to perform an additional, for example upstream, filtering of the differences, for example by adding the differences. Furthermore, the converter-associated differences can be compared with the average value. Here, in the case where the converter-associated difference is greater than the average value, adapting the converter-specific time delays can consist in reducing the converter-specific delay.

In some exemplary embodiments, this can have the advantage that adapting in the case of a linear signal section is carried out solely on the basis of differences between the converter-associated digital values. This can have the advantage that the method can be independent of the absolute value of the signal and/or of offsets, for example temporally variable offsets on account of drift of the signal and/or at least one of the analog-to-digital converters.

An analog-to-digital conversion of useful signals can then be carried out using analog-to-digital converter arrangements calibrated in this way.

The methods described can be carried out repeatedly in some exemplary embodiments. This can be implemented for example at specific predefined instants, or as a reaction to altered operating conditions and/or ambient conditions, for example changed clock frequencies or ambient temperatures. In some cases, such fluctuations are referred to as PVT (process, voltage, temperature) fluctuation. This can have the advantage that the methods and circuits can be less susceptible vis-à-vis these influences.

One example of the above methods is explained with reference to FIGS. 3 and 4.

Figure 3A:
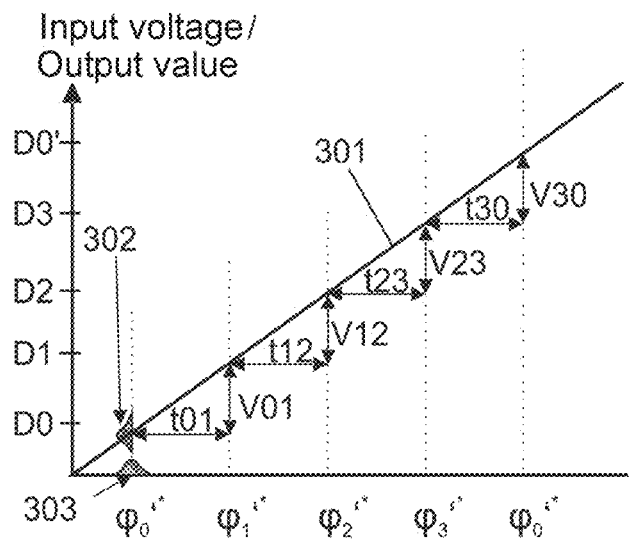
FIG. 3a shows a temporal profile of signals as a function of time in some exemplary embodiments in a calibrated state.

FIG. 3a shows a temporal profile of signals as a function of time in a calibrated state.

Figure 3B:
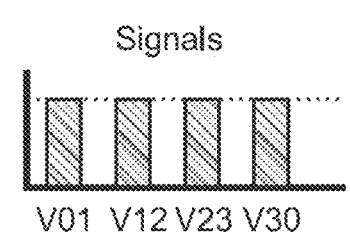
FIG. 3b shows one example of an evaluation of the values from FIG. 3a in accordance with some exemplary embodiments in a calibrated state.

FIG. 3b shows in respect thereof results in accordance with various exemplary embodiments of FIG. 3a.

FIG. 3a shows one example of a calibration of the at least two analog-to-digital converters by means of the predefined signal 301 already mentioned above. The signal 301 is plotted as a function of time in FIG. 3a. In the example shown, the predefined signal 301 is a linear continuously monotonically rising ramp. As described above, the shown part of the signal 301 can be a signal section of a periodic signal. The signal 301 is shown in an idealized manner. In practice, both the actual signal 301 and the analog-to-digital converters can be influenced by noise 302 and/or jitter 303 and other factors and have other values and/or waveforms as a result. By way of example, the linear ramp or the digitized form of the linear ramp, as described above, can have inaccuracies and/or nonlinearities to a certain extent.

In the example shown, the signal 301 is converted into converter-associated digital values D0', D0-D3 by four analog-to-digital converters at five different sampling instants $\varphi 0^*$, $\varphi 1^*$, $\varphi 2^*$, $\varphi 3^*$, $\varphi 0'^*$. Such a method can be carried out for example by means of the device described in FIG. 1, wherein the different sampling instants $\varphi 0^*$, $\varphi 1^*$, $\varphi 2^*$, $\varphi 3^*$, $\varphi 0'^*$ can correspondingly be determined by delayed clock signals provided by four delay circuits, which clock signals can be used in accordance with the delay circuits 105 shown in FIG. 1. The sampling instants are thus determined by the clock signal fed and also the respective converter-specific time delay, wherein inherent influences, for example as a result of errors in the adapting, as described above, can additionally occur as well.

If only a single pass of the method is carried out, the sampling instant $\varphi 0'^*$ does not exist and an associated difference V30 (see below) cannot be calculated. By contrast, if the measurements are repeated multiply and the duration of the predefined signal is longer than the duration required for sampling in each analog-to-digital converter, e.g. a period of the clock signal of the analog-to-digital converters, a single one of the analog-to-digital converters can determine different digital values at different instants. This is shown as an example in FIG. 3 at the sampling instants $\varphi 0^*$ and $\varphi 0'^*$, wherein the analog-to-digital converter having the index 0, for example 106a in FIG. 1, digitizes the value D0 at the sampling instant $\varphi 0^*$ and the value D0' at the instant $\varphi 0'^*$.

In some exemplary embodiments, the method can be carried out over a plurality of signal periods of the predefined periodic signal.

In this case, the method for calibrating can be carried out during at least one first period of the multiplicity of periods for a first group of analog-to-digital converters and can be carried out during at least one second period of the multiplicity of periods for a second group of analog-to-digital converters, wherein at least one first analog-to-digital converter of the arrangement of analog-to-digital converters is contained both in the first group of analog-to-digital converters and in the second group of analog-to-digital converters and at least one second analog-to-digital converter of the arrangement of analog-to-digital converters is contained only in one of the first group and second group and adapting the at least two converter-specific time delays d1-d4 is based on at least one converter-associated digital value D0',D0-D3 from the first group of analog-to-digital converters and at least one converter-associated digital value D0',D0-D3 from the second group of analog-to-digital converters.

By way of example, it is possible to carry out the method in association with FIG. 1 as follows:

A first group consisting of the two analog-to-digital converters 106a and 106b is chosen in the first period, a second group consisting of the two analog-to-digital converters 106b and 106c is chosen in the second period, and a third consisting of the two analog-to-digital converters 106c and 106d is chosen in the third period.

In another example, the method can be carried out as follows:

In the first period the analog-to-digital converters 106a and 106b, in the second period the analog-to-digital converters 106a and 106c and in the third period the analog-to-digital converters 106a, 106d are chosen in each case as a group.

Many further permutations and different selections of the analog-to-digital converters that are respectively active in a period are possible.

Hereinafter, with the exception of the first analog-to-digital converter, a respective difference V01 to V23 between the converter-associated value of the respective analog-to-digital converter and the converter-associated value of the previous analog-to-digital converter (i.e. the analog-to-digital converter having the directly preceding sampling instant) is formed. In exemplary embodiments in which the converters are driven repeatedly for sampling, the difference V30 between the last converter and the first converter can likewise be ascertained.

In some exemplary embodiments, the respective difference of the second converter V12 is calculated as a difference between converter-associated digital values D2 and D1. As a result of this procedure, in these exemplary embodiments, it may be possible to use the analog-to-digital converters as very accurate time measuring instruments. In the example shown, on account of the linear ramp, the time that elapsed between two sampling instants, for example $\varphi 0^*$ and $\varphi 1^*$, is proportional to the respective difference V01 between the converter-associated digital values D1 and D0. In the example shown in FIG. 3a, the differences V01 to V30 are substantially identical. This is shown in FIG. 3b, where the differences V01 to V03 are illustrated as a bar chart. It can thus be deduced from the bar chart in FIG. 3b that, in the example shown, there is no time skew between the analog-to-digital converters and the latter are synchronized.

In order to ascertain the bar chart shown in FIG. 3b, the method explained in principle with reference to FIG. 3a and in the text above can be refined. The method can be applied to exemplary embodiments in which the processes 201 and 202 of the method described with reference to FIG. 2 are carried out repeatedly, or can be based on a single pass of method steps 201 and 202. In the exemplary embodiments having repetitions, it is possible to carry out an averaging, or a related method, for example a summation of all respective differences V01-V30 for a plurality of repetitions as effective averaging with or without normalization, in order to reduce or eliminate the influence of noise and jitter. In addition, it may be possible, by means of permutations of the converter-specific time delays, as described above, to avoid influences of nonlinearities of the predefined signal and/or other disturbance influences. Calibration measurements in general can also be repeated multiply. In some exemplary embodiments, it is possible to carry out a summation across a plurality of repetitions of the calibration measurement. By means of such oversampling, it may be possible to achieve a better calibration resolution than the magnitude of the least significant bit (LSB) of the analog-to-digital converters used.

In the exemplary embodiments described, the conversion of the predefined signal by the analog-to-digital converters can be carried out in a normal conversion operating mode, which can also be used after the calibration step for the analog-to-digital conversion of an arbitrary analog useful signal. Consequently, in some exemplary embodiments, the calibration is carried out under the same conditions that are present in the normal conversion operating mode. By way of example, the work loads at the clock buffer of the analog-to-digital converters can be identical or similar. As a result, it may be possible that the accuracy of the time skew calibration does not deteriorate as a result of a change from a calibration operating mode to a normal conversion operating mode. This procedure can be referred to as foreground calibration of the time skew.

These abovementioned advantages of operation in the normal conversion mode can also apply to signal profiles different than those in the examples shown in FIG. 3a.

Figure 4A:
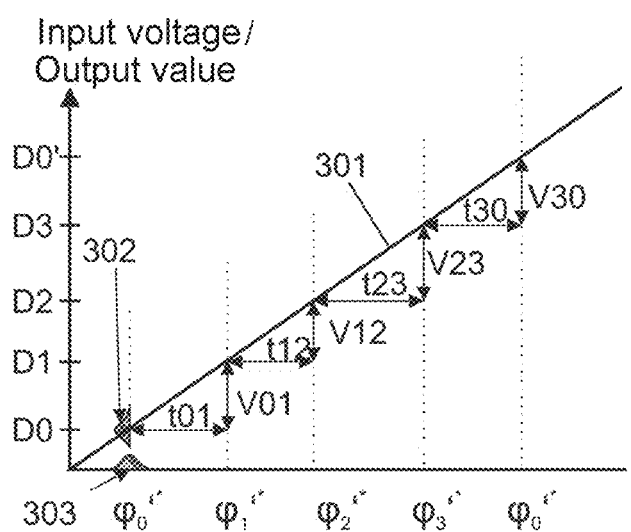
FIG. 4a shows a temporal profile of signals as a function of time in some exemplary embodiments in an uncalibrated state.

FIG. 4a shows a temporal profile of exemplary signals as a function of time. FIG. 4b shows in respect thereof one example in an uncalibrated state.

The example shown in FIG. 4 substantially corresponds to the example shown in FIG. 3a. In contrast to FIG. 3A, however, there is now a time skew between analog-to-digital converter 1, which samples the predefined signal at the instant φ1* and converts it into a converter-associated digital value D1, and converter 2, which samples the predefined signal at the instant φ2* and converts it into a converter-associated digital value D2. In the example shown, the delay between converter 2 and converter 1 is too short. This additionally has the consequence that the time difference between analog-to-digital converter 2 and analog-to-digital converter 3 is too long.

Figure 4B:
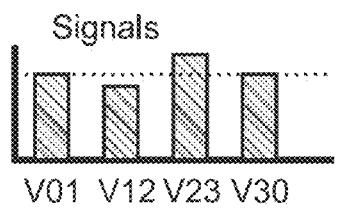
FIG. 4b shows one example of an evaluation of the values from FIG. 4a in accordance with some exemplary embodiments in an uncalibrated state.

This shortening of the time skew between the analog-to-digital converters 1 and 2 is clearly discernible in the bar chart in FIG. 4b, since the value V12 is lower than the average value of the differences. Conversely, the value V23 is too large, which is likewise readily discernible in the bar chart. On the basis of such an evaluation, the time skew between the respective converters can be corrected by means of adapting the converter-specific time delays, such that all differences are of equal magnitude (corresponding e.g. to a phase offset of 90° in the case of four converters) and uniform sampling and conversion of the analog signal is thus carried out.

Figure 5:
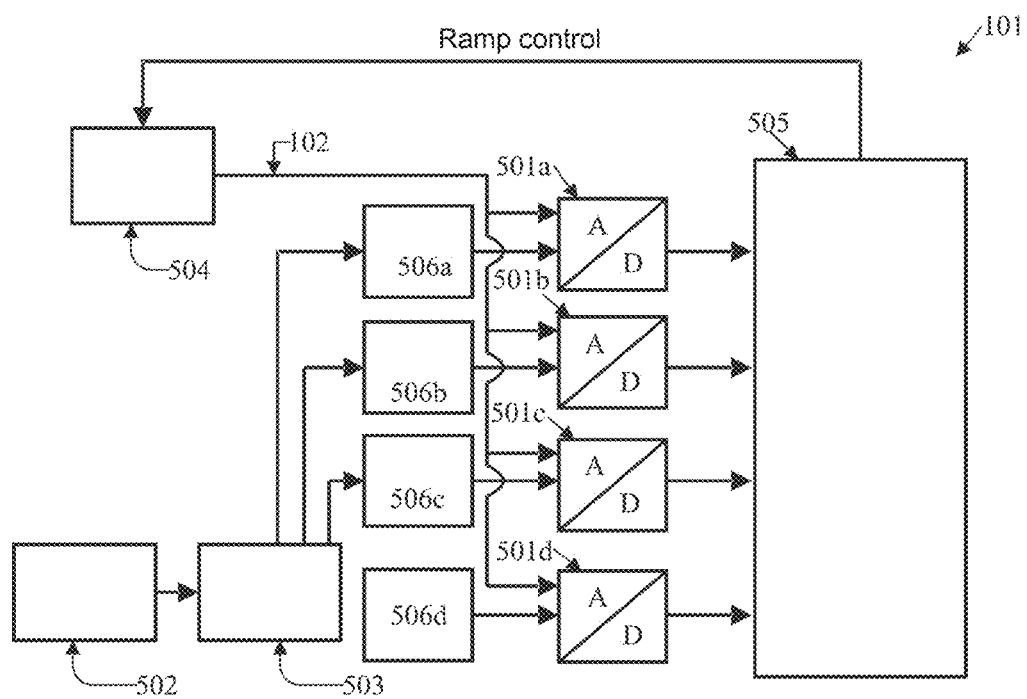
FIG. 5 schematically shows a device in accordance with various exemplary embodiments.

FIG. 5 schematically shows a device in accordance with various exemplary embodiments.

FIG. 5 shows a device for analog-to-digital conversion, comprising an arrangement of analog-to-digital converters 501a-d. Four analog-to-digital converters 501a-501d are present in the example shown. In this case, the analog-to-digital converters 501 are configured to receive a clock signal. The clock signal can be provided for example by a clock generator 502 such as a quartz oscillator in conjunction with a phase-locked loop. At least one of the analog-to-digital converters 501, all four thereof in the case shown in FIG. 5, is coupled to a time skew circuit 503. In further exemplary embodiments, in particular, one of the analog-to-digital converters 501 can receive the clock signal directly. Providing the clock signal with a converter-specific time delay can be carried out by means of delay circuits 506a-d. The delay circuits 506a-d can comprise for example for providing a fixed portion of the converter-specific time delay and an analog variable delay circuit for providing a variable portion of the converter-specific time delay. This can be realized by means of clock division, for example. Said delay circuits can be coupled to the time skew circuit in various ways. In the example shown in FIG. 5, the delay circuits 506a-d are coupled to the time skew circuit 503 in each case via individual lines. Such a coupling, as explained above in association with FIG. 4b, can have the effect that a non-uniform time skew, for example in the case of an excessively short time skew vis-à-vis the previous converter, becomes apparent as an excessively long time skew vis-à-vis the subsequent converter.

Other configurations are likewise possible, however, for example the concatenation of the individual delay circuits 506a-d, such that, for example, only the first delay circuit 506a has a direct coupling to the time skew circuit 503, and the time delay circuit 506b is coupled to an output of the time delay circuit 506a and the outputs of the time delay circuit are respectively coupled to a succeeding time delay circuit. Such a coupling of the time delay circuits 506a-d results in a different behavior of the differences, for example V03 to V30, plotted for example in the bar charts 3b, 4b, which has to be taken into account accordingly during the adapting at 203 in the method in FIG. 2.

In addition, in the case of such a concatenation, it may be necessary to implement further measures which can ensure that all conversions are concluded in a timely manner, for example within a signal period of the predefined signal. In some exemplary embodiments, this can be ensured by monitoring the respective converter-specific time delays, for example by means of the sum of all the respective converter-specific time delays. Such monitoring can be carried out for example by the control circuit 505.

The time delay circuit 503 is thus configured to provide for the analog-to-digital converters the clock signal with a converter-specific time delay.

The analog-to-digital converters 501 are configured to convert a received analog input signal into a converter-associated digital output signal.

Furthermore, the device comprises a signal generator circuit 504, which is coupled to the analog-to-digital converters 501. The signal generator circuit 504 is configured to provide an analog predefined signal to the analog-to-digital converters, as explained above.

In some exemplary embodiments, the signal generator circuit 504 can be a buffer circuit, as described further below in association with FIG. 5. In these cases, the signal generator circuit 504 can function either as input buffer or as signal generator depending on the operating mode.

The device furthermore comprises a control circuit 505, which is configured to receive the converter-associated digital output values and to perform an adaptation of the setting of the converter-specific time delay circuit on the basis of the converter-associated digital output values. The control circuit 505 can carry out calculations e.g. on the basis of the values shown in association with FIGS. 3a, 3b and 4a, 4b, for example by means of the values plotted in the form of bar charts. By means of the methods described above, the control circuit 505 can adapt the delay circuits 506 until a time skew no longer occurs, or the time skew is sufficiently small, or is as low as possible. The control circuit can be designed to repeat measurements and to reverse the direction of the signal (rising or falling) for calibration in order to ensure, for example, that no saturation of the signal occurs.

In addition, the control circuit can be configured such that the orders of the analog-to-digital converters are varied in different measurement passes, that is to say that the converter-specific time delays are interchanged as it were. In some exemplary embodiments, in the case of periodic signals, it is possible to vary the order in different passes such that it is possible to achieve a uniform distribution of the respective sampling instants of the analog-to-digital converters over the period of the signal. In some exemplary embodiments, this can be carried out uniformly over the entire period duration or part of the period duration. Permutations, as described above, can be used for this purpose.

In some exemplary embodiments, a particularly steep ramp can additionally be chosen. This can have the advantage that a high time resolution can be achieved by means of the calibration method.

The above exemplary embodiments can make the described calibration methods and/or the devices robust vis-à-vis inaccurate signal profiles, for example caused by nonlinearities of substantially linear signals and/or characteristic features of the transfer curves of the analog-to-digital converters.

FIG. 6 shows a buffer circuit in accordance with various exemplary embodiments.

A buffer circuit 601 is shown in FIG. 6. The buffer circuit 601 shown can constitute a modification of a buffer circuit which is already present in an analog-to-digital converter and which for example can be present for providing the analog input signal 102 in FIG. 1 or can be the signal generator circuit 504 in FIG. 5. In the example shown, the buffer circuit 601 shown comprises two buffer inputs 602a, 602b for two analog signals, for example a differential analog signal. In addition, the buffer circuit 601 comprises two calibration control inputs 604a, 604b. The buffer circuit 601 comprises two analog outputs 603a, 603b. The buffer circuit 601 is configured to operate in two operating modes.

In a buffer operating mode, the buffer circuit 601 is configured to receive the two analog signals at the two buffer inputs 602a, 602b and to provide them at the two analog outputs 603a, 603b. In the example shown, this functionality is provided by an operational amplifier 605, or an assembly comprising an operational amplifier 605, in conjunction with feedback resistors 607a, 607b.

In a calibration operating mode, the buffer circuit 600 is configured to provide a predefined signal at the two analog outputs 603a, 603b.

In the present example, the predefined signal is a linear ramp as shown as an example in FIGS. 3a and 4a. Said ramp is provided by two current sources 608a, 608b and also by two capacitances 609a, 609b and two reset switches 610a, 610b.

The switchover between the buffer operating mode and the calibration operating mode is carried out by means of the calibration control input 604a. As shown in FIG. 6, in the calibration operating mode "cal", the switches identified by "cal" are closed; the other switches are open. The buffer operating mode is identified by "cal". In the buffer operating mode, all switches identified by "cal" are closed, and switches identified by "cal" are open. In this operating mode, only the feedback resistors 607A, 607B are connected between buffer input and buffer output. In the calibration operating mode, by means of the switches, the feedback resistors 607A, 607B are disconnected from the operational amplifier 605 and the capacitances 609a, 609b and also the reset switches 610a, 610b are coupled to the operational amplifier 605. In addition, it is possible to control the rate of rise and the direction (rising or falling) of the calibration signal by means of the current sources 608a, 608b and also by means of the switches 611a and 611b, which enable a switchover between the switch positions S-A and the switch positions S-B of the current sources 608a, 608b. The values of the capacitances 609a, 609b and/or the type of actuation of the reset switches 610a, 610b additionally determine the properties of the calibration signal. In this case, the control can be carried out by means of the second control input 604b. Further possibilities such as, for example, changing the capacitances and driving the reset switch can likewise be performed by control inputs, but are not illustrated in the example. In the calibration operating mode, the integrator circuit at the operational amplifier 605, by means of the capacitances 609a, 609b, results in a linear ramp that is provided to the outputs 610a, 610b of the buffer circuit 601. As shown on the basis of the switches at the buffer inputs 602a, 602b, the input signal is disconnected from the inputs of the buffer in the calibration operating mode.

Although specific exemplary embodiments have been illustrated and described in this description, persons who have routine technical knowledge will recognize that a multiplicity of alternative and/or equivalent implementations can be chosen as a replacement for the specific exemplary embodiments shown and described in this description, without departing from the scope of the invention shown. The intention is for this application to cover all adaptations or variations of the specific exemplary embodiments discussed here. Therefore, the intention is for this invention to be restricted only by the claims and the equivalents of the claims.

At least some embodiments are defined by the examples given below:

Example 1

A method for calibrating at least two analog-to-digital converters (106a-d, 501a-d), wherein the at least two analog-to-digital converters (106a-d, 501a-d) each receive a clock signal (104), wherein at least one of the at least two analog-to-digital converters (106a-d, 501a-d) receives the clock signal (104) with a converter-specific time delay (d1-d4), comprising: feeding an analog predefined signal (301) to the at least two analog-to-digital converters (106a-d, 501a d), converting the predefined signal (301) into at least two converter-associated digital values (D0', D0-D3) by means of the at least two analog-to-digital converters

17

(106*a-d*, 501*a-d*), wherein the converting is based in each case on the respectively received clock signal (104), adapting the at least one converter-specific time delay (d1-d4) on the basis of the at least two converter-associated digital values (D0', D0-D3).

Example 2

The method according to example 1, wherein the method furthermore comprises decreasing all the converter-specific time delays (d1-d4), if at least one of the converter-specific time delays (d1-d4) reaches a maximum value, and/or increasing all the converter-specific time delays (d1-d4) if at least one of the converter-specific time delays (d1-d4) reaches a minimum value.

Example 3

The method according to example 1 or 2, wherein the predefined signal (301) at least in sections is a strictly monotonically rising and/or strictly monotonically falling signal.

Example 4

The method according to example 1 or 2, wherein the predefined signal (301) is a periodic signal.

Example 5

The method according to example 4, wherein adapting the converter-specific time delays (d1-d4) is based on a multiplicity of conversions over a multiplicity of periods of the predefined signal (301).

Example 6

The method according to any of examples 1-5, wherein the method is carried out repeatedly, wherein for each carrying out the at least two analog-to-digital converters are selected from an arrangement (101, 501) of at least three analog-to-digital converters (106*a-d*, 501*a-d*), wherein the adapting is carried out on the basis of the at least two converter-associated values from the repeated passes.

Example 7

The method according to any of examples 4-6, wherein the periodic signal (301) comprises a first and a second signal section, wherein a periodic signal is strictly monotonically rising in the first signal section.

Example 8

The method according to example 7, wherein the periodic signal (301) is strictly monotonically falling in the second signal section.

Example 9

The method according to any of the preceding examples 5-8, wherein at least two of the at least two analog-to-digital converters (106*a-d*, 501*a-d*) receive the clock signal (104) with a converter-specific time delay (d1-d4), wherein the multiplicity of conversions over at least two periods of the predefined signal (301) comprises a permutation of the converter-specific time delays (d1-d4) between at least two of the multiplicity of periods of the predefined signal (301), and wherein in particular adapting the at least two converter-specific time delays (d1-d4) is based on an averaging of the converter-associated digital values (D0', D0-D3) over the at least two periods of the predefined signal (301).

Example 10

The method according to example 9, wherein adapting the at least two converter-specific time delays is based on at least one first difference, which is ascertained on the basis of two converter-associated digital values in at least one first period of the predefined signal, and on a second difference, which is ascertained on the basis of two converter-associated digital values in at least one second period of the predefined signal.

Example 11

The method according to any of examples 7-10, wherein the predefined signal (301) is substantially linear in the first signal section and/or second signal section.

Example 12

The method according to any of examples 1-11, wherein adapting the converter-specific time delays (d1-d4) is based on a comparison of the at least two converter-associated digital values (D0', D0-D3) with a known characteristic of the predefined signal (301).

Example 13

The method according to example 11, wherein the at least two analog-to-digital converters (106*a-d*, 501*a-d*) comprise at least three analog-to-digital converters (106*a-d*, 501*a-d*), which each receive the clock signal (104) with a converter-specific time delay (d1-d4), and wherein: the calibration is carried out during a substantially linear signal section (301), a respective difference between the converter-associated value (D0', D0-D3) of the respective converter and the converter-associated value (D0', D0-D3) of a respective previous analog-to-digital converter (106*a-d*, 501*a-d*) is formed, an average value is formed from the converter-associated differences (V01, V12, V23, V30), the converter-associated differences (V01, V12, V23, V30) are compared with the average value, and, in the case where the converter-associated difference is greater than the average value, the adapting consists in reducing the converter-specific delay.

Example 14

A method for the analog-to-digital conversion of analog signals by means of at least two analog-to-digital converters (106*a-d*, 501*a-d*), which involves carrying out a calibration of at least one converter-specific time delay (d1-d4) according to any of the preceding examples.

Example 15

The method according to any of the preceding examples, wherein the analog predefined signal (301) is generated on the basis of a control signal.

Example 16

A buffer circuit (601), comprising at least one buffer input (602*a*, 602*b*) for at least one analog signal, at least one calibration control input (604a,b) and at least one analog output (603a, 603b), wherein the buffer circuit comprises at least one operational amplifier (605) which comprises first terminals, comprising a first terminal and a second terminal, and wherein the buffer circuit is configured to comprise at least the following operating modes: a buffer operating mode, wherein the buffer circuit (601) is configured, in reaction to a received first signal at the at least one calibration control input (604a,b), to connect at least one resistor (607a,b) between the first terminal of the operational amplifier (605) and the second terminal of the operational amplifier (605) such that the at least one analog signal is received at the at least one buffer input (602a, 602b) and is provided at the at least one analog output (603a, 603b), and a calibration operating mode, wherein the buffer circuit (601) is configured, in reaction to a received second signal at the at least one calibration control input (604a,b), to connect at least one capacitance (609a, b) between the first terminal and the second terminal of the operational amplifier (605) and to connect a reset switch (610a,b) in parallel with the at least one capacitance (609a, b) and also to connect at least one current source (608a,b) to the first input of the operational amplifier (605).

Example 17

The buffer circuit according to example 16, wherein the buffer circuit (601) comprises a second current source (608a,b), wherein the second current source (608a,b) is coupled to the first current source (608a,b) by an arrangement of switches, wherein the arrangement of switches is configured to reverse the polarity of the signal (301) generated in the calibration operating mode by actuating the at least two switches.

Example 18

The buffer circuit according to example 16 or 17, wherein the at least one operational amplifier (605) is a differential operational amplifier (605) which comprises second terminals, comprising a third terminal and a fourth terminal, wherein the second terminals are connected up like the first terminals.

Example 19

A device comprising: at least two analog-to-digital converters (106a-d, 501a-d), wherein the at least two analog-to-digital converters (106a-d, 501a-d) are configured to receive a respective clock signal (104), wherein at least one of the analog-to-digital converters (106a-d, 501a-d) is coupled to a converter-specific time delay circuit (105a-d, 506a-d) configured to provide for the at least one analog-to-digital converter (106a-d, 501a-d) the clock signal (104) with a converter-specific time delay (d1-d4), and the at least two analog-to-digital converters (106a-d, 501a-d) are configured to convert a received analog input signal (102) into converter-associated digital values (D0', D0-D3), wherein the at least two analog-to-digital converters (106a-d, 501a-d) are configured to receive an analog predefined signal (301) as the analog input signal, and a control circuit (505), which is configured to receive the converter-associated digital values (D0', D0-D3) generated in response to the analog predefined signal and to perform an adaptation of a setting of the converter-specific time delay circuit (105a-d, 506a-d) on the basis of the converter-associated digital values (D0', D0-D3).

Example 20

The device according to example 19, wherein the device comprises a signal generator circuit (504) for generating the analog predefined signal, wherein the signal generator circuit is a buffer circuit (601) according to any of examples 16-18.

Example 21

The device according to example 20, wherein the control circuit (505) is configured to switch over the buffer circuit (601) between buffer operating mode and calibration operating mode and to control and/or set the calibration signal (301) by means of the at least one calibration control input (604a,b).

Example 22

A system which comprises one or more devices according to any of examples 16-21 and/or is configured to carry out a method according to any of examples 1-15.

What is claimed is:

1. A method for calibrating at least two analog-to-digital converters, wherein the at least two analog-to-digital converters each receive a clock signal, and at least one of the at least two analog-to-digital converters receives the clock signal with a converter-specific time delay, the method comprising:
feeding an analog predefined signal to the at least two analog-to-digital converters, wherein the analog predefined signal is at least one of
a periodic signal, or
at least in sections is a strictly monotonically rising signal or a strictly monotonically falling signal;
converting the analog predefined signal into at least two converter-associated digital values using the at least two analog-to-digital converters, wherein the converting is based on the received clock signal; and
adapting the converter-specific time delay based on the at least two converter-associated digital values.

2. The method as claimed in claim 1, wherein the method further comprises decreasing the converter-specific time delay when the converter-specific time delays reaches a maximum value; or
increasing all the converter-specific time delay when the converter-specific time delays reaches a minimum value.

3. The method as claimed in claim 1, wherein the periodic signal comprises a first signal section and a second signal section, and wherein the periodic signal is strictly monotonically rising in the first signal section.

4. The method as claimed in claim 3, wherein the periodic signal is strictly monotonically falling in the second signal section.

5. The method as claimed in claim 3, wherein the analog predefined signal is substantially linear in the first signal section or in the second signal section.

6. The method as claimed in claim 5, wherein the at least two analog-to-digital converters comprise at least three analog-to-digital converters, which each receive the clock signal with a respective converter-specific time delay, and wherein:
calibration is performed during a substantially linear signal section,
a respective difference between the converter-associated value of the respective converter and the converter-associated value of a respective previous analog-to-digital converter is formed,
an average value is formed from the converter-associated differences,
the converter-associated differences are compared with the average value,
adapting comprises reducing the converter-specific delay when the converter-associated difference is greater than the average value.

7. The method as claimed in claim 1, wherein adapting the converter-specific time delay is based on a multiplicity of conversions over a multiplicity of periods of the analog predefined signal.

8. The method as claimed in claim 7, wherein
at least two of the at least two analog-to-digital converters receive the clock signal with a respective converter-specific time delay;
wherein the multiplicity of conversions over at least two periods of the analog predefined signal comprises a permutation of the respective converter-specific time delays between at least two of the multiplicity of periods of the analog predefined signal; and
wherein the adapting the at least two respective converter-specific time delays is based on an averaging of the converter-associated digital values over the at least two periods of the analog predefined signal.

9. The method as claimed in claim 8, wherein adapting the at least two converter-specific time delays is based on:
at least one first difference ascertained based on the two converter-associated digital values in at least one first period of the analog predefined signal; and
a second difference ascertained based on the two converter-associated digital values in at least one second period of the analog predefined signal.

10. The method of claim 1, further comprising generating the analog predefined signal based on a control signal.

11. The method as claimed in claim 1, wherein adapting the converter-specific time delay is based on a comparison of the at least two converter-associated digital values with a known characteristic of the analog predefined signal.

12. The method as claimed in claim 1, wherein:
the method is performed for a repeated number of times;
wherein for each time the method is performed, the at least two analog-to-digital converters are selected from an arrangement of at least three analog-to-digital converters; and
wherein the adapting is carried out based on the at least two converter-associated values from performing the method the repeated number of times.

13. A buffer circuit comprising:
at least one buffer input for at least one analog signal, at least one calibration control input, and at least one analog output, wherein the buffer circuit comprises at least one operational amplifier having a first set of terminals, the first set of terminals comprising a first terminal and a second terminal, and wherein the buffer circuit is configured to operate in at least the following operating modes:
a buffer operating mode, wherein the buffer circuit is configured, in reaction to a received first signal at the at least one calibration control input, to connect at least one resistor between the first terminal of the at least one operational amplifier and the second terminal of the at least one operational amplifier such that the at least one analog signal is received at the at least one buffer input and is provided at the at least one analog output, and
a calibration operating mode, wherein the buffer circuit is configured, in reaction to a received second signal at the at least one calibration control input, to connect at least one capacitance between the first terminal and the second terminal of the at least one operational amplifier and to connect a reset switch in parallel with the at least one capacitance and also to connect at least one current source to the first input of the at least one operational amplifier.

14. The buffer circuit as claimed in claim 13, wherein the buffer circuit comprises a second current source, wherein the second current source is coupled to the first current source by an arrangement of switches, wherein the arrangement of switches is configured to reverse a polarity of the signal generated in the calibration operating mode by actuating at least two switches of the arrangement of switches.

15. The buffer circuit as claimed in claim 13, wherein the at least one operational amplifier is a differential operational amplifier further comprising a third terminal and a fourth terminal.

16. A device comprising:
at least two analog-to-digital converters,
wherein the at least two analog-to-digital converters are configured to receive a respective clock signal, wherein at least one of the analog-to-digital converters is coupled to a converter-specific time delay circuit configured to provide for the at least one analog-to-digital converter the clock signal with a converter-specific time delay, and the at least two analog-to-digital converters are configured to convert a received analog input signal into converter-associated digital values, and
wherein the at least two analog-to-digital converters are configured to receive an analog predefined signal as the analog input signal, wherein the analog predefined signal is at least one of
a periodic signal, or
at least in sections is a strictly monotonically rising signal or a strictly monotonically falling signal; and
a control circuit configured to receive the converter-associated digital values generated in response to the analog predefined signal and to perform an adaptation of a setting of the converter-specific time delay circuit based on the converter-associated digital values.

17. The device as claimed in claim 16, wherein the device comprises a signal generator circuit for generating the analog predefined signal, wherein the signal generator circuit includes a buffer circuit comprising:
at least one buffer input for at least one analog signal, at least one calibration control input, and at least one analog output, wherein the buffer circuit comprises at least one operational amplifier having a first set of terminals, the first set of terminals comprising a first terminal and a second terminal, and wherein the buffer circuit is configured to operate in at least the following operating modes:
a buffer operating mode, wherein the buffer circuit is configured, in reaction to a received first signal at the at least one calibration control input, to connect at least one resistor between the first terminal of the operational amplifier and the second terminal of the operational amplifier such that the at least one analog signal is received at the at least one buffer input and is provided at the at least one analog output, and
a calibration operating mode, wherein the buffer circuit is configured, in reaction to a received second signal at the at least one calibration control input, to connect at least one capacitance between the first terminal and the second terminal of the operational amplifier and to connect a reset switch in parallel with the at least one capacitance and also to connect at least one current source to the first input of the operational.

18. The device as claimed in claim 17, wherein the control circuit is configured to switch the buffer circuit between the buffer operating mode and the calibration operating mode and to control or the calibration signal using the at least one calibration control input.

* * * * *